(12) United States Patent
Staggert

(10) Patent No.: US 7,592,796 B2
(45) Date of Patent: Sep. 22, 2009

(54) PLATE WITH AN INDICATOR FOR DISCERNING AMONG PRE-IDENTIFIED PROBE HOLES IN THE PLATE

(75) Inventor: Scott Staggert, Greenfield, MN (US)

(73) Assignee: Circuit Check, Plymouth, MN (US)

( * ) Notice: Subject to any disclaimer, the term of this patent is extended or adjusted under 35 U.S.C. 154(b) by 6 days.

(21) Appl. No.: 11/130,625

(22) Filed: May 16, 2005

(65) Prior Publication Data

US 2005/0258852 A1    Nov. 24, 2005

Related U.S. Application Data

(60) Provisional application No. 60/572,315, filed on May 18, 2004.

(51) Int. Cl.
*G01R 31/28* (2006.01)

(52) U.S. Cl. .................................. 324/158.1; 324/758

(58) Field of Classification Search ................ 324/754, 324/758, 765, 761; 174/260–262; 428/221, 428/306.6; 439/65–67, 74; 361/748–761, 361/807; 29/830, 837
See application file for complete search history.

(56) References Cited

U.S. PATENT DOCUMENTS

| | | | | |
|---|---|---|---|---|
| 4,491,295 A | * | 1/1985 | Thornton et al. | 249/53 R |
| 4,788,496 A | * | 11/1988 | Maelzer et al. | 324/754 |
| 5,211,567 A | * | 5/1993 | Neumann et al. | 439/74 |
| 5,385,477 A | * | 1/1995 | Vaynkof et al. | 439/66 |
| 5,527,189 A | * | 6/1996 | Middlehurst et al. | 439/608 |
| 5,600,099 A | * | 2/1997 | Crotzer et al. | 174/257 |
| 5,785,538 A | * | 7/1998 | Beaman et al. | 439/91 |
| 5,967,804 A | * | 10/1999 | Yoshizawa et al. | 439/91 |
| 6,297,458 B1 | * | 10/2001 | McMillan et al. | 174/250 |
| 6,356,089 B2 | * | 3/2002 | Bayer et al. | 324/754 |
| 6,535,008 B1 | | 3/2003 | Casale | |
| 6,768,331 B2 | * | 7/2004 | Longson et al. | 324/761 |
| 6,961,231 B1 | * | 11/2005 | Alexander et al. | 361/321.2 |
| 7,188,989 B2 | * | 3/2007 | Miyashita | 362/621 |
| 7,405,947 B1 | * | 7/2008 | Goergen | 361/788 |
| 7,458,818 B2 | * | 12/2008 | Kiyofuji et al. | 439/66 |
| 2002/0104683 A1 | * | 8/2002 | Teshima et al. | 174/262 |
| 2003/0164244 A1 | * | 9/2003 | Miyazawa et al. | 174/52.4 |

OTHER PUBLICATIONS

Declaration of Neil Adams, 2 pages, Aug. 2003.

* cited by examiner

*Primary Examiner*—Ha Tran T Nguyen
*Assistant Examiner*—Arleen M Vazquez
(74) *Attorney, Agent, or Firm*—Altera Law Group, LLC

(57) ABSTRACT

Disclosed is a system and method for providing an effective means for making it easy to identify which holes in an interface plate are to be populated with probes and which are to be left empty. This identification of holes or apertures in a plate is used most commonly an electrical probe testing plates where a probe array is set up and inserted though the plate. The problem is that it is very difficult to double check to see if all probes are installed. With a two-tone color identifier (or other techniques disclosed herein) it is easy to visually or machine read the probe plate for probe installation errors. The method employs coating the plate with a colorant and ablating colorant adjacent holes, which are either populated or empty, the difference being easy to spot.

14 Claims, 2 Drawing Sheets

PLATE WITH AN INDICATOR FOR DISCERNING AMONG PRE-IDENTIFIED PROBE HOLES IN THE PLATE

CROSS-REFERENCE TO RELATED APPLICATIONS

This is a Non-Provisional (Utility) patent application of provisional application Ser. No. 60/572,315, filed May 18, 2004

STATEMENT REGARDING FEDERALLY SPONSORED RESEARCH OR DEVELOPMENT

Not Applicable

TECHNICAL FIELD

This application relates to a system and method for providing an effective means for identification of holes or apertures in a plate, most commonly an electrical probe testing plate.

BACKGROUND

Circuit board testers are used for testing a variety of circuit boards or similar devices to assure that the circuit boards operate as intended. In at least one type of circuit board tester, such as Agilent Model No. 3070, Series 3, a separate device, referred to as a fixture, is used to position the circuit board such that a plurality of electrically conductive probes (which are part of, or coupled to, the tester) contact predetermined components or positions of the circuit board. The particular components or positions that are contacted by the test or probes depend on the tests that are desired. When the probes are in contact with the desired locations on the circuit board, electrical signals with predetermined parameters (e.g., predetermined magnitudes or patterns of current, voltage frequency phase and the like) are applied by the tester, typically under control of a computer, to certain probes. Some or all of the probes are used to measure the performance or response of the circuit board (i.e., to measure electrical parameters of some or all of the probes contacting the circuit board). In this way, it is possible to rapidly perform a number of tests or measurements characterizing the performance of the circuit board while simulating the conditions the circuit board would have, or could have, during actual use. Although it is possible to use these types of tests (and testing devices) for a variety of possible purposes (such as "spot checking" selected circuit boards at a production facility, testing circuit boards which may be malfunctioning, testing prototype circuit boards as part of a design program and the like), in at least some applications, circuit board testing is used to provide quality assurance on all or substantially all products of a given type or class which are produced by a company.

In at least some situations, it is desired to provide a tester with probes at two or more levels with respect to a direction normal to the plane of the unit under test (UUT) e.g., by providing some probes having a first height and other probes having a second height. This arrangement affords the opportunity to perform two or more different sets of tests such that the points at which probes contact the UUT during one set of tests are different from (or a subset of) the points at which probes contact the UUT during another set of tests. Typically, in such a "dual stage" testing situation, the UUT is first positioned so as to contact all probes (and perform a first set of tests), and then positioned to contact only the taller set of probes (at points of the UUT which are determined by the location of the tall probes) and a second set of tests are performed using only the taller probes. Although many different testing procedures can be used, as will be understood by those of skill in the art, in at least some situations, the taller probes may be used for functional tests and/or boundary scan tests (such as the boundary scan tests as described in IEEE Standard No. 1149.1).

In at least one previous approach, the circuit board is moved in the direction of the probes, typically causing the taller probes, which may be provided with a spring-urged telescoping structure, to partially collapse or telescope down to the level of the smaller probes, such that substantially both sets of probes (the taller probes and the shorter probes) contact the UUT at desired positions. With the board held in this position, a first set of tests (such as functional tests and/or boundary scan tests) can be performed. After tests are performed using the full set of probes the vacuum is released such that the UUT is positioned to contact only the taller probes (which telescope upwardly) and a second set of tests (such as tests directed to measuring performance or characteristics of individual components on the UUT) can be performed.

The testers generally contain a plate as part of the tester that functions as a mechanical stand-off for the fixture. While the fixture is held rigidly in place against the plate, or against rigid stand-offs fastened to the plate, the probes make contact with the circuit board through various holes in the plate. The plates are usually supplied by the tester manufacturer with regularly spaced holes, usually in a rectangular grid, so that a given plate from the tester manufacturer may be used to test a variety of circuits. Even though a circuit generally requires its own custom layout for the probe locations, the plate, because of its standardized hole configuration, may be used relatively independently of the specific locations of the probes, and may also be reused when the tester is reconfigured to test a new circuit. This standardization of the hole locations reduces the number of custom parts required for a tester, and thereby reduces the cost of the system.

The plates are typically molded from a plastic material, such as polycarbonate, so that the array of holes may be built right into the mold. Because they are molded, not drilled, there is no additional cost required for drilling the holes. In addition, the resulting plastic part is non-conducting, which is important for insulation of the electrically conductive probes from each other.

These plates are commercially available, and a model that fits the above-mentioned Agilent circuit tester is sold as the "3070 alignment plate."

A potential drawback to a completely standardized plate is that it generally requires considerable effort to identify particular holes during the final inspection of the tester prior to usage. Typically, a technician will have to verify the location of each probe manually, by counting the row and column values of each probe (seen visually through a hole in the plate), then comparing the values to those in a published list as part of the tester layout drawings. If there are dozens of probes, all specifically located in a rectangular array that contains hundreds of identical-looking holes, this may be a very time-consuming procedure for the technician, and may lead to errors in probe placement if the technician counts incorrectly. Accordingly, it would be useful to provide a plate with simple identification features, so that a technician may readily visually identify which holes are to accept probes.

One prior art solution is to manually mark each hole in the plate that will receive a probe during operation. This solution turns out to be simple in theory, but very labor-intensive, and therefore very expensive. Accordingly, it would be useful to provide a plate with simple identification features that may be identified using the same tools that provide the tester configuration drawings (reducing the possibility of human error in determining the locations.) Additionally, the identification features should be inexpensive, and not require a custom-fabricated plate for each particular circuit under test.

SUMMARY

The one aspect of the present invention is a plate with identification features, so that a subset of holes in the plate may be visually identified by distinguishing between holes with indicia and holes without.

The invention is presented as a product and method of making.

As a product, there is disclosed a probe plate have a plurality of holes and a first and second surface of a predetermined indicia, the plate having a first and second subsets of holes through the plate, the first subset and second subset being mutually exclusive. There is a second indicia applied to the second face, said second indicia being different from said predetermined indicia, so that the applied indicia is discernible from the predetermined indicia, the second indicia being absent adjacent said second subset of holes. This makes it possible to distinguish between holes of the first and second subset.

As a method, there is disclosed a method of identifying specific holes in a probe plate having one side of a predetermined color and first and second subsets of probe holes. The steps in this embodiment are, covering an area adjacent said first and second holes with an indicator; and removing the indicator adjacent holes of said first subset. This permits the holes of first and second subsets can be distinguished from each other by the differential in between the color and the indicator.

In a further embodiment, a first side of the plate, preferably the side opposite the fixture and circuit board during operation of the tester, is coated with a thin layer of paint, so that the area in between all the holes is generally uniformly coated. The paint is preferably colored in contrast to the unpainted color of the plate. A subset of the holes is identified, and the paint surrounding each hole in the subset is removed.

Keep in mind that this summary is not meant to define the invention in any way, but to assist the reader in becoming familiar with the technology presented in the specification. The claims below define the scope of the patent, not this summary.

DETAILED DESCRIPTION OF THE PREFERRED EMBODIMENTS

Figure 1:
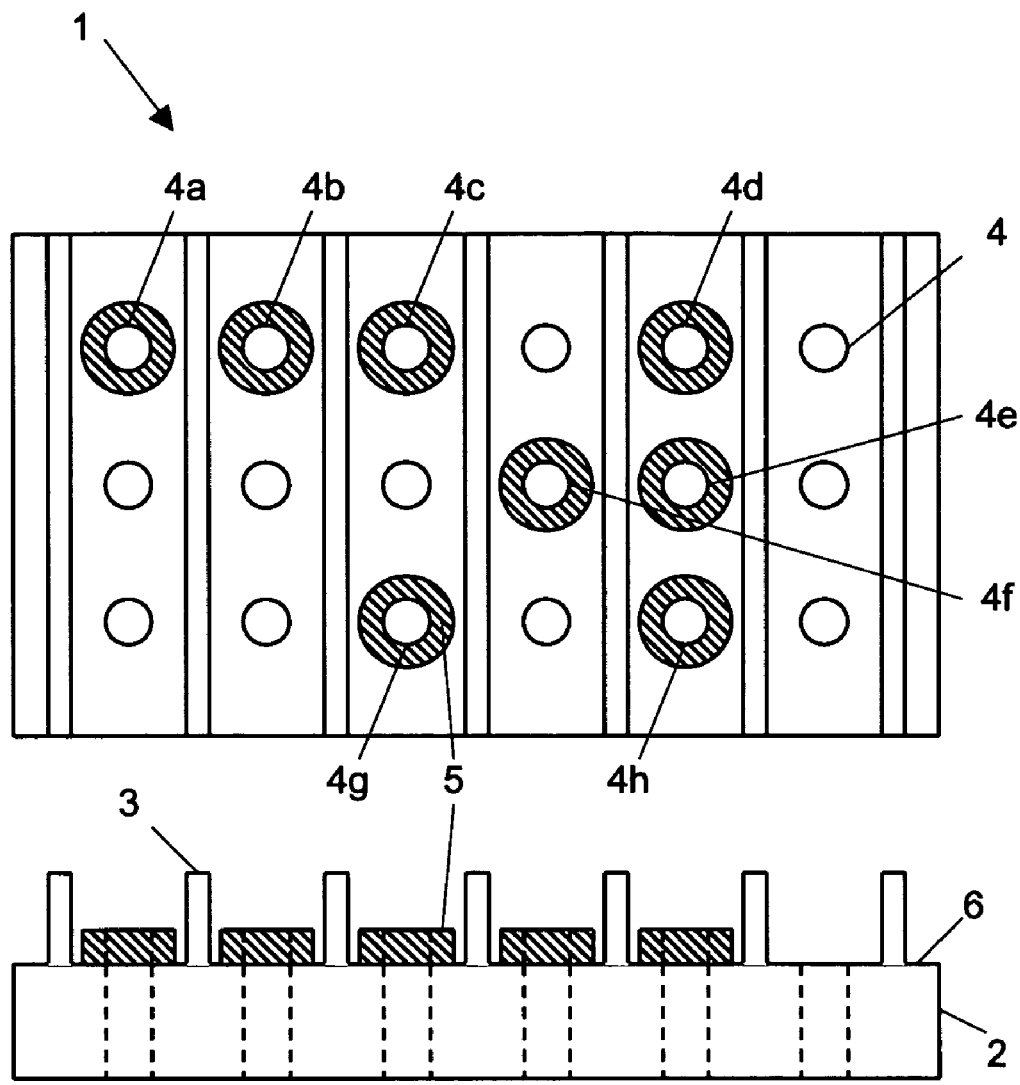
FIG. 1 is a schematic of a prior art grooved plate with a subset of holes identified manually.

FIG. 1 shows a prior art interface or probe plate 1, which contains a first face 6 and a plurality of holes 4. The holes 4 are drawn in a rectangular array, but it will be appreciated that the holes 4 may be configured arbitrarily on the plate 1. As used in a circuit board tester, the plate 1 is typically built into the tester, and typically provides a mechanical surface against which parts may be held during the test procedure. A fixture that contains a circuit board under test may be placed rigidly in contact opposite the grooves 3 on the second face (not identified in FIG. 1) of the plate 1, and a plurality of electrical probes access various points on the circuit board through various holes 4 in the plate 1. During the testing procedure, the probes apply and measure various voltages and currents at specific locations in a circuit board under test, generally to ensure that the circuit performs adequately. Typically, a single probe corresponds to a single hole 4 in the plate 1.

Prior to usage of the tester, the various electrical probes must be configured to test specific locations in a particular circuit. The probe locations are typically generated at the CAD (computer assisted drafting) level, usually by the same tools that lay out the components on the circuit boards. The probe locations may be documented in CAD drawings and communicated to a technician that configures the probes manually, or may be encoded and communicated electronically to an automated device that configures the probes.

Once the tester probes are properly configured and the plate 1 is attached to the tester, a subset 4a-4h of the holes 4 in the plate 1 will receive probes during operation of the tester. The remainder of the holes 4 that are not in the subset 4a-4h do not receive probes during operation of the tester. It will be appreciated that the number and locations of the holes in subset 4a-4h depend on the circuit under test, and are relatively unimportant for the present invention.

The final step in the manufacturing process for the prior art plate 1 is a manual identification of the subset 4a-4h of holes 4 that receive probes. The manufacturer of the prior art plate 1 then manually marks each hole 4 in the subset 4a-4h by hand, typically by painting (i.e. using an indicator (indicia)) a small area around each hole 4 in the subset 4a-4h on the first face 6. Thus, it is the painted areas which are to have probes inserted. Although the marked areas surrounding each hole 4 in the subset 4a-4h are drawn as circular in FIG. 1, it will be appreciated that the markings may be of any shape or pattern, as long as each marking is readily identifiable with exactly one hole 4 in the subset 4a-4h. They do not have concentric paint markings. The indication or indicator marking can be adjacent the hole, so long as it is clear which hole is referred to.

A severe drawback to the manual marking system of the prior art plate 1 is that it is very labor-intensive, and therefore very expensive. For a plate 1 that requires dozens of markings, in an array with hundreds of holes, the marking procedure can be quite significant, and in some cases, can be the greatest expense in producing the plates 1.

Although one may be tempted to fabricate a new plate for each circuit under test, with holes only where probes are placed, this would be expensive and largely impractical. The prior art plate 1 is generally molded from a plastic material, such as polycarbonate, and has its holes incorporated into the mold itself. A custom prior art plate 1 molded in this manner, with holes only where required by the user, would require a custom mold for each user, which is impractically expensive. Additionally, the drilling of holes in a blank plate, while possible, is also more expensive than the prior art technique of manually marking the holes. Accordingly, there is a need for a plate that has a large number of holes for flexibility, but has a way of inexpensively identifying a subset of the holes to simplify the final inspection of the tester.

Figure 2:
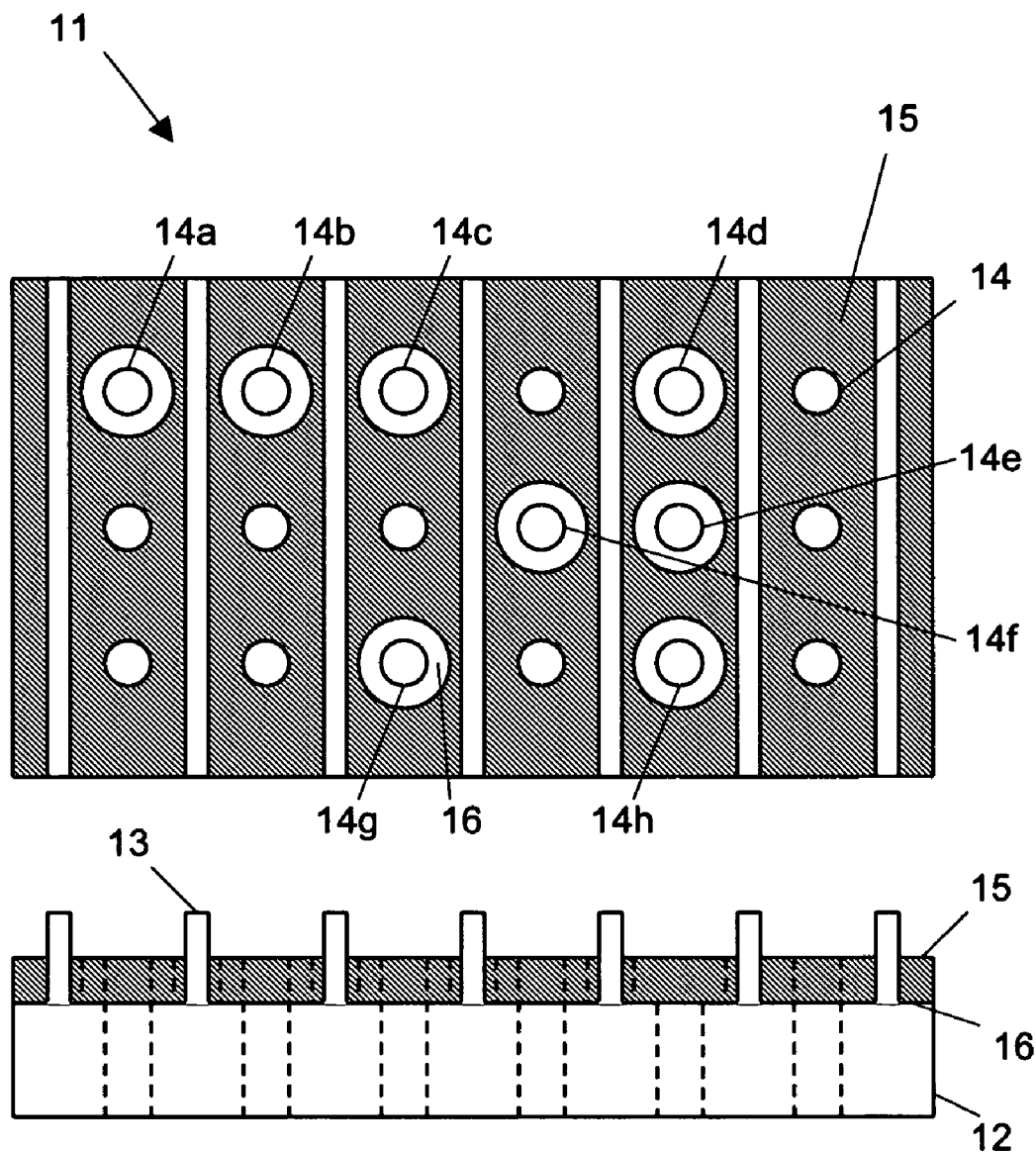
FIG. 2 is a schematic of a grooved plate with a subset of holes identified according to an embodiment of the present invention.

FIG. 2 shows a plate 11 in an embodiment of the present invention. A coating (a first indicia) 15 is applied to a first face 16 of an uncoated plate 12, preferably in the area (grooves) between the ridges 13. The outwardly extending ridges 13 may be coated as well, but at the risk of flaking or peeling of the coating 15. The uncoated plate 12 contains a plurality of holes 14, and the coating 15 does not fill in the holes 14. The coating 15 may be a paint, a two-part epoxy, or an other opaque coating, preferably of a color of a high contrast with the color of the uncoated plate 12. Preferably, the coating 15 is not electrically conductive. For example, if the uncoated plate 12 is dark-colored, a suitable coating 15 may be commercially available; "Polane T-White" paint. The paint 5 is preferably in high contrast to the unpainted color of the bare plate 2. For example, if the bare plate 2 is a dark-colored polycarbonate material, then the paint or ink 5 should be a light color (any contrasting color will do), so that the marked holes 4 are readily visibly detected, by eye or by a machine vision system.

In the case where a drilling machine will remove the paint, which is the preferred solution, we have found that it is important to match the paint with the base material very carefully. In initial attempts, we found that the drill would not only scrape a circular hole, but also cause the paint to chip and remove paint from adjacent holes. Vibration might also cause the paint to flake. The preferred base material is a hard plastic, so a paint which adheres well (such as that mentioned above) should be chosen and tested. Thus in our preferred solution, the indicator, or paint applied to the base plate should fixedly adhere thereto, so that when being drilled, scraped or otherwise removed to as the hole marker.

In a subset 14a-14h of holes 14, the coating 15 has been removed in the region around each hole 14 in the subset 14a-14h, exposing the first face 16 underneath. Because the coating (a second color indicia) 15 contrasts with the color (a first color indicia) of the uncoated plate 12, each hole 14 in the subset 14a-14h is readily visually identifiable, whether by eye or by a camera in a machine vision system.

Preferably, the removal of the coating around each hole 14 in the subset 14a-14h is performed by an automated tool, such as an automated drill that receives a set of subset 14-14h locations from a CAD file. The automated drill preferably uses a drill bit larger than the hole 14 diameter, and drills only enough material to completely remove the coating 15, without substantially drilling through the first face 16. For example, if the coating 15 has a thickness of roughly 0.1 mm, then the drill may remove roughly 0.5 mm of material. The uncoated plate 12 may be substantially thicker than 0.5 mm. Note that drilling such shallow holes is an inexpensive procedure compared to drilling comparable through holes, and that very little waste material is produced. Additionally, if the user decides to add another hole 14 to the subset 14a-14h, he may mark the added hole by hand, simply by turning a drill bit centered in the hole by hand and grinding for a few seconds; the coating 15 comes off readily.

It will be understood that the grooves 13 on the plate 11 are not essential for the present invention. A similar coating 15 may be applied to an uncoated plate that has physical features other than grooves, such as posts, or has no physical features at all. The coating 15 may be applied to the regions between holes 14, so that when removed, the hole may be readily visibly identified by eye or by a machine vision system as part of the subset 14a-14f.

As used in a circuit board tester, the plate 11 of FIG. 2 would readily identify the subset 14a-14h of holes 14 that receive probes during operation. Because of the high contrast between the coating 15 and the color of the uncoated plate 12, the technician easily sees the exposed first face 16 in the regions around each hole 14 in the subset 14a-14h, and can then quickly complete the final inspection of the probe locations prior to operation. If the technician finds any holes 14 in the subset 14a-14h that are missing a probe, or finds a probe in a hole 14 that is not in the subset 14a-14h, he can take corrective actions. Because the entire subset 14a-14h is visible all at once to the technician, without the need for manually counting rows and columns, the efficiency of the inspection process is greatly improved.

Typically, when a tester is customized to test a particular circuit, a set of drawings is made by a computer assisted drawing (CAD) machine, well known in the art, and presented to a technician. The technician uses the drawings to configure the tester, and the drawings typically indicate the locations and types of the probes. Alternatively, the CAD machine may generate an automated set of instructions for placement of the probes during assembly of the tester. In the present invention, the CAD machine may generate an additional set of instructions for denoting which holes in the plate are to receive probes. The additional instructions may be used by an automated drilling machine that ablates or scrapes off the paint in the area surrounding each hole that receives a probe. The drilling machine uses a drill bit of a larger diameter than the hole, and only drills until the paint is removed; it does not drill substantially into the plate itself and does not increase the diameter of the hole.

Once the paint is removed around a particular hole, the hole is readily identified visually, either by eye or by use of a machine vision system. "Visual" in this context there is not limited to vision related detection. It includes optical and non optical methods. It can also include machine-readable detection/recognition, tactile detection, by creating ridges, depressions, etc. Once the tester is configured, each hole in the subset should contain a probe, and no probes should be present in holes not contained in the subset. Once all the probes are configured, a final visual inspection of the tester is relatively simple, as the technician may simply look at the plate and ensure that each hole in the subset has a probe that extends through it, and that none of the probes extend through holes not in the subset.

I claim:

1. An indicator interface plate configured to provide readily visible identification of predetermined holes, the plate comprising:
   a surface including a plurality of holes having visually discernable markings to allow a user to visually determine which of said plurality of holes are to be populated, wherein a region of the plate said plurality of holes have a first predetermined indicia covering the surface surrounding said plurality of holes, the plate further comprising: a second removable indicia overlying said first predetermined indicia, said
   second indicia being different from said first predetermined indicia, wherein said second indicia is removed from areas of said plate adjacent each of said predetermined holes, said predetermined holes are visually identifiable to a user by the appearance of the first indicia.

2. The plate of claim 1 wherein said first predetermined indicia is the color of the material of the plate itself.

3. The plate of claim 1 wherein the first and second indicia are visually distinguishable from each other.

4. The plate of claim 1, wherein the first and second indicia are distinguishable from each other one the basis of tactile differentiation.

5. The plate of claim 1, wherein the predetermined first and second indicia are distinguishable from each other by machine recognition.

6. The plate of claim 1 wherein the second predetermined indicia is a colorant which is applied over the plurality of holes.

7. The plate of claim 1 wherein the second indicia is a colorant applied selectively to areas of said plate adjacent each of said predetermined holes.

8. The plate of claim 1 wherein the second indicia is applied to all areas of said plate adjacent each of said predetermined holes.

9. The plate of claim 1 wherein said surface further includes a plurality of outwardly extending ridges between said plurality of holes.

10. An indicator interface device configured to provide immediate visual identification of predetermined holes, the device comprising:
 a substantially planar plate having a plurality of holes having visually discernable markings to allow a user to visually determine which of said plurality of holes are to be populated; said substantially planar plate having a first predetermined color; and a coating of a second predetermined color overlying a surface of said substantially planar plate adjacent each of said predetermined holes, said second predetermined color being a different color from said first predetermined color, wherein said coating is removed from areas of said plate adjacent each of said predetermined holes, said predetermined holes are visually identifiable to a user by the appearance of the predetermined color.

11. The indicator device of claim 10 wherein said coating is bonded to said planar plate.

12. The indicator device of claim 11 wherein said coating is applied to the entire surface of the planar plate.

13. The indicator device of claim 11 wherein said coating is applied around the peripheral edge of each of said plurality of holes.

14. The indicator device of claim 11 wherein said coating is applied in sufficient thickness to cover the planar plate.

* * * * *